United States Patent
Berke et al.

(10) Patent No.: US 7,499,286 B2
(45) Date of Patent: Mar. 3, 2009

(54) MOUNTING ADAPTER FOR ELECTRONIC MODULES

(75) Inventors: Stuart Allen Berke, Austin, TX (US); Jeffrey Michael Lewis, Maynard, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/513,807

(22) Filed: Aug. 31, 2006

(65) Prior Publication Data

US 2008/0055875 A1    Mar. 6, 2008

(51) Int. Cl.
*H05K 5/00*    (2006.01)

(52) U.S. Cl. .................. 361/756; 361/686; 361/727; 361/790

(58) Field of Classification Search ........... 361/756, 361/800, 741, 727, 686, 802, 788, 790; 439/377, 439/374; 312/223
See application file for complete search history.

(56) References Cited

U.S. PATENT DOCUMENTS

| | | | |
|---|---|---|---|
| 4,821,146 A * | 4/1989 | Behrens et al. ............. | 361/692 |
| 6,201,708 B1 * | 3/2001 | Lewis et al. .................. | 361/788 |
| 6,259,605 B1 * | 7/2001 | Schmitt ....................... | 361/727 |
| 6,552,915 B2 * | 4/2003 | Takahashi et al. ........... | 361/796 |
| 6,661,671 B1 * | 12/2003 | Franke et al. ................ | 361/752 |
| 7,001,217 B2 * | 2/2006 | Bright et al. ................ | 439/609 |
| 7,214,088 B1 * | 5/2007 | Liang .......................... | 439/377 |
| 7,230,833 B1 * | 6/2007 | Sickels ........................ | 361/747 |
| 2006/0211298 A1 * | 9/2006 | Campini et al. ............. | 439/502 |

OTHER PUBLICATIONS

Berke et al., U.S. Appl. No. 11/513,849, filed Aug. 31, 2006, entitled "Spacing Device for Modular System."

* cited by examiner

*Primary Examiner*—Hung S Bui

(57) ABSTRACT

A mounting adapter for inserting one or more electronic modules in a system is disclosed. The mounting adapter includes a sleeve having first and second portions that are each configured to receive an electronic module. The sleeve also includes a dividing member that cooperates with the first and second portions to define at least two volumes for receipt of electronic modules. Additionally, the sleeve is configured for insertion in a slot of a receptacle that is configured to receive an electronic module larger than the electronic modules the sleeve is designed to receive.

25 Claims, 5 Drawing Sheets

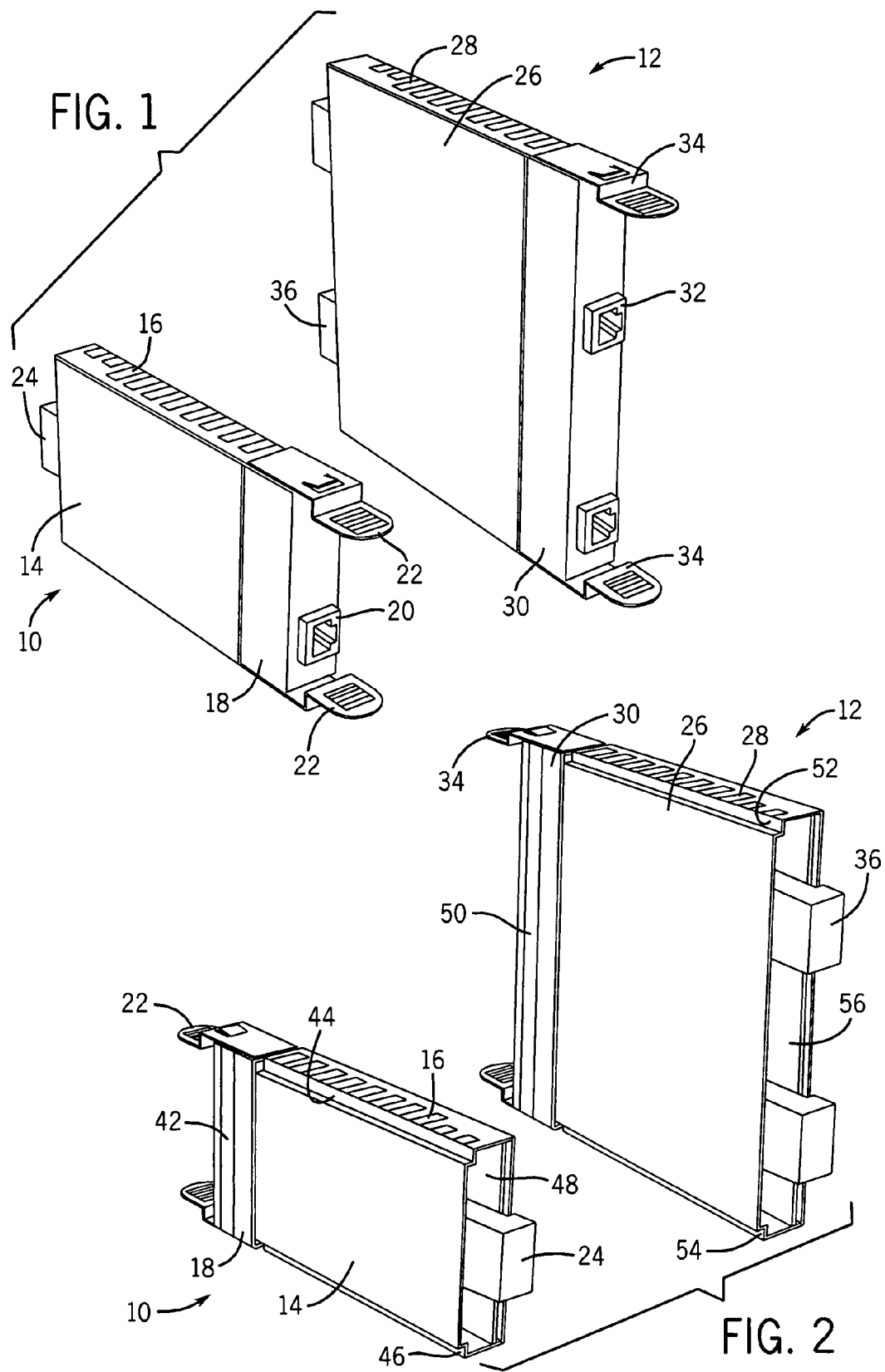

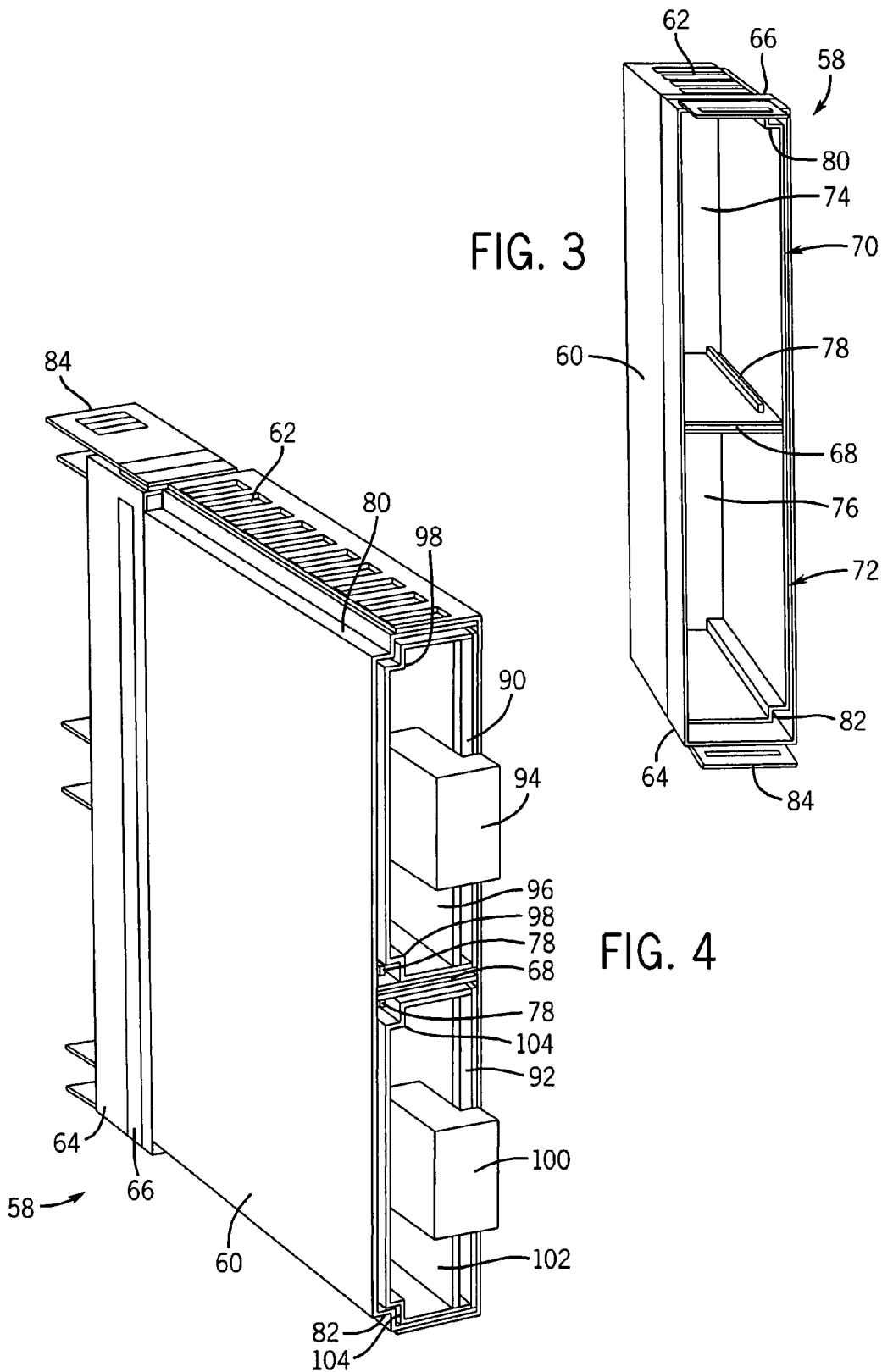

MOUNTING ADAPTER FOR ELECTRONIC MODULES

BACKGROUND

This section is intended to introduce the reader to various aspects of art, which may be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

Businesses and individuals use computing devices, such as servers, in a wide range of applications. Use of these devices has become increasingly common and each generation of computing devices is seemingly more advanced than the previous generation. However, this technological advance is generally accompanied by a corresponding increase in the complexity of these devices. As the number of circuits or components of a device increase, so do the chances that one of these circuits or components will fail, which may ultimately affect operation of the device. Accordingly, many electronic devices are now manufactured in such a manner as to facilitate user removal or installation of various components of an electronic device. This allows a user to not only replace a malfunctioning component of a device, but also allows such a user to customize a device to achieve a desired configuration.

To facilitate ease of removal and installation, a component of a computing server or other electronic device may be enclosed within a cartridge or module. Such an arrangement provides protection for the individual parts of the modular component, while increasing the ease with which the component may be handled. To accommodate these modules, servers may contain cardcages adapted to receive and secure the modules. These cardcages are generally designed with slots that receive modules of a fixed height between the upper and lower portions of the cardcage. While this arrangement may allow certain modules of equal height to be inserted and removed from the cardcage, such cardcages are not designed to accept modules of varying height. As will be appreciated, some components may be less complex than others and, thus, do not necessarily require an enclosure having the same volume as a more complex device. Further, some modules may require a greater number of lanes to communicate with, and operate in, a given server than do other modules. Thus, there is a need for a modular cardcage system that allows utilization of modules of varying heights.

BRIEF DESCRIPTION OF THE DRAWINGS

FIG. 1 is a front perspective view of an exemplary pair of electronic modules in accordance with one embodiment of the present techniques;

FIG. 2 is a rear perspective view of the electronic modules illustrated in FIG. 1;

FIG. 3 is a front perspective view of an exemplary adapter sleeve in accordance with one embodiment of the present techniques, the adapter sleeve configured to receive and secure two electronic modules therein;

FIG. 4 is a rear perspective view of the adapter sleeve of FIG. 3, depicting two exemplary electronic modules inserted therein;

DETAILED DESCRIPTION OF SPECIFIC EMBODIMENTS

Figure 5:
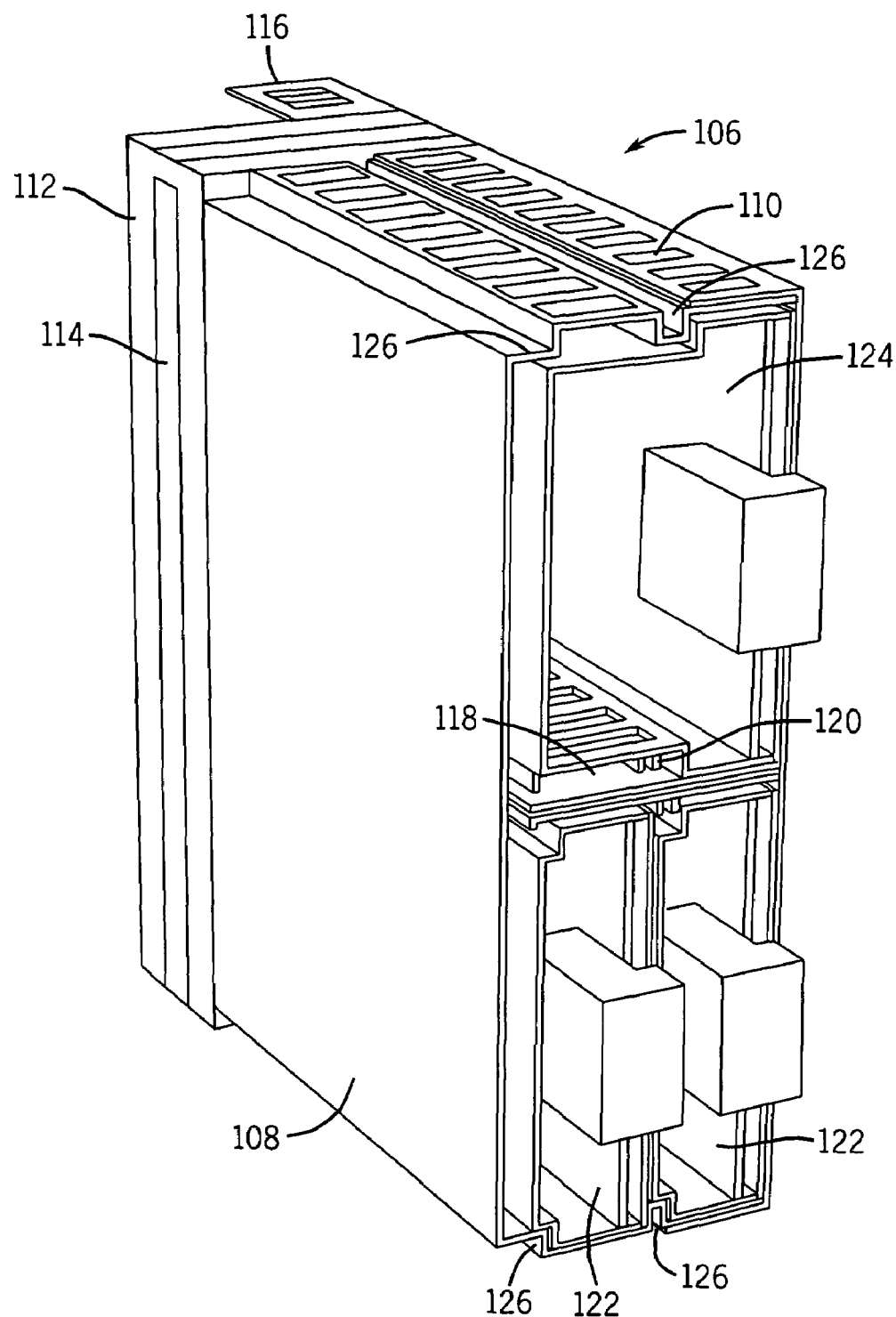
FIG. 5 is a rear perspective view of an adapter sleeve containing three electronic modules in accordance with an alternative embodiment of the present techniques.

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Various embodiments of the present invention are directed to a modular cardcage system that allows modules of various heights and widths to be mounted within a single cardcage. Particularly, the present techniques utilize an adapter sleeve to enable installation of one or more smaller modules in a cardcage slot configured to receive a larger module. In one embodiment, an adapter sleeve is configured for insertion in a slot of a cardcage and further configured to receive two smaller modules such that the sleeve and smaller modules are capable of occupying the slot of the cardcage configured for a larger module.

Turning now to the figures, FIG. 1 illustrates an exemplary pair of electronic modules in accordance with one embodiment of the present techniques. Particularly, certain features of a device or base module 10 and device or full module 12 are depicted. It should be noted that, while modules of certain embodiments may have PCI Express ExpressModule™ (formerly Server I/O Module (SIOM)) form factors, the present techniques are similarly applicable to other modules or form factors. As used herein, the term "module" refers to an electronic device that plugs into a backplane and has a partially or fully enclosed circuit board. Accordingly, base module 10 includes an enclosure or housing 14 for protecting internal circuitry of the module. In the presently illustrated embodiment, enclosure 14 includes a plurality of apertures or vents 16 that facilitate convective cooling of the internal circuitry. While apertures, such as apertures 16, generally promote heat transfer away from the internal components, in other embodiments, in which cooling is of lesser concern, enclosures may not have such apertures.

Enclosure 14 may be coupled to a bulkhead 18. In one embodiment, bulkhead 18 is formed from metal to facilitate EMI shielding as discussed below. Alternatively, the bulkhead 18 could also be formed with other materials, such as plastic, ceramic, or the like. Further, in the illustrated embodiment, base module 10 also includes an input-output connector 20 and latching features 22. The input-output connector 20 facilitates electronic communication between base module 10 and other electronic components. Base module 10 is configured to be connected to a backplane via connector 24, as discussed in greater detail below with respect to FIG. 6. As will be appreciated, in various embodiments, latching features 22 may comprise resilient clips, snaps, screws, hooks, tool-free fasteners, or other such structures, in full accordance with the present techniques.

Full module 12 includes a number of features similar to those found in base module 10. For instance, full module 12 includes an enclosure 26 having ventilation apertures 28, a bulkhead 30, input-output connectors 32, and latching features 34. Full module 12 also includes one or more backplane connectors 36. Notably, in the presently illustrated embodiment, the height of full module 12 is slightly greater than twice the height of base module 10. These proportions allow two base modules 10 to be inserted into an adapter sleeve for insertion into a slot of a system configured to receive the full module 12, as discussed in further detail below.

It should be noted that, although the presently illustrated modules are communication modules having input-output connectors 20 and 32, the present techniques are not limited to such modules. For instance, other communications modules may contain wireless communication technology, which may replace or supplement physical connectors such as connectors 20 and 32. Indeed, the present techniques are not limited to communication modules, but may be used with any modular system in which modules are plugged into a backplane. For example, other modules that may benefit from the present techniques include processor modules, memory modules, hard drive modules, optical drive modules, USB modules, or the like, in addition to communication modules.

Various additional features of the exemplary modules are illustrated in FIG. 2. As shown therein, base module 10 includes an EMI gasket 42, one or more alignment features such as upper indentation 44 and lower indentation 46, and circuit board 48, which supports various circuitry coupled to connector 24. Similarly, full module 12 includes an EMI gasket 50, alignment features such as indentations 52 and 54, and circuit board 56 for supporting the various circuitry of the module.

FIG. 3 illustrates an exemplary adapter sleeve 58 in accordance with certain embodiments of the present techniques. Notably, adapter sleeve 58 is configured to contain two electronic base modules. As may be appreciated by one skilled in the art, this arrangement allows two base modules with eight-lane signaling to occupy the same space as a full module with sixteen-lane signaling, such as a sixteen-lane PCI Express port that is bifurcatable into two independent eight-lane links. As may also be appreciated, the same techniques could be applied with links of other widths, such as a proprietary twenty-lane link that may be divided into two independent ten-lane links.

The adapter sleeve 58 generally includes a body 60 having a plurality of apertures 62 that facilitate convective cooling of electronic modules placed in the sleeve. Sleeve 58 also includes a bulkhead 64 and an EMI gasket 66. In one embodiment, the bulkhead 64 is conductive in order to facilitate shielding of the modules from electromagnetic interference. In this embodiment, base modules inserted into the sleeve make EMI contact with the conductive bulkhead 64. In a further embodiment, EMI gasket 66 interfaces with adjacent modules or sleeves to further the shielding aspects of the system.

A support shelf 68 is provided within the body 60 and generally divides the body into a first portion 70 and a second portion 72, which includes a first volume 74 and second volume 76, respectively. Both first portion 70 and second portion 72 are configured to receive an electronic module. In one embodiment, the portions 70 and 72 have retaining features to aid in securing electronic modules within the adapter sleeve 58. To facilitate alignment of the electronic modules with the sleeve, support shelf 68 includes one or more guide features, such as guide rails 78. Further, sleeve 58 also includes alignment features, such as indentations 80 and 82, to facilitate insertion of the sleeve 58 in an electronic system, and latching features 84 are provided to secure the sleeve 58 once inserted into such a system. As will be appreciated by one skilled in the art, guide features of other embodiments may differ with respect to those illustrated in the FIG. 3. For instance, in one embodiment, the support shelf guide features of an adapter sleeve include grooves configured to receive guide rails of electronic modules. Similarly, in another embodiment, an adapter sleeve may include external rails, in place of indentations, configured for insertion in a groove of a cardcage or housing.

Electronic modules 90 and 92 may be inserted within sleeve 58 as illustrated in FIG. 4. As may be appreciated, first and second electronic modules 90 and 92 may generally include features similar to those provided in exemplary base module 10 illustrated above. As illustrated, a first electronic module 90 includes a backplane connector 94 coupled to a circuit board 96 and alignment features 98. In turn, second electronic module 92 includes backplane connector 100 coupled to circuit board 102 and includes alignment features 104. As may be seen in the present illustration, alignment features 98 and 104 of electronic modules 90 and 92 cooperate with guide rails 78 and alignment features 80 and 82 to align modules 90 and 92 with sleeve 58 during insertion.

In an alternative embodiment, such as that illustrated in FIG. 5, an adapter sleeve 106 is configured to receive four base modules 122, or two double-wide base modules 124 having a width approximately twice that of base module 122, or some combination thereof. Similar to the arrangement described with respect to FIGS. 3 and 4, adapter sleeve 106 allows two double-wide base modules 124 with eight-lane signaling to occupy the same space as a double-wide full module with sixteen-lane signaling. Sleeve 106 generally includes a body 108 having ventilation apertures 110, a bulkhead 112, an EMI gasket 114, and latching features 116. Adapter sleeve 106 also includes a support shelf 118 having guide rails 120 for facilitating alignment and insertion of modules 122 and 124. Additionally, adapter sleeve 106 includes alignment features 126 which facilitate alignment of the sleeve with a larger system, in addition to facilitating alignment of the inserted electronic modules.

Figure 6:
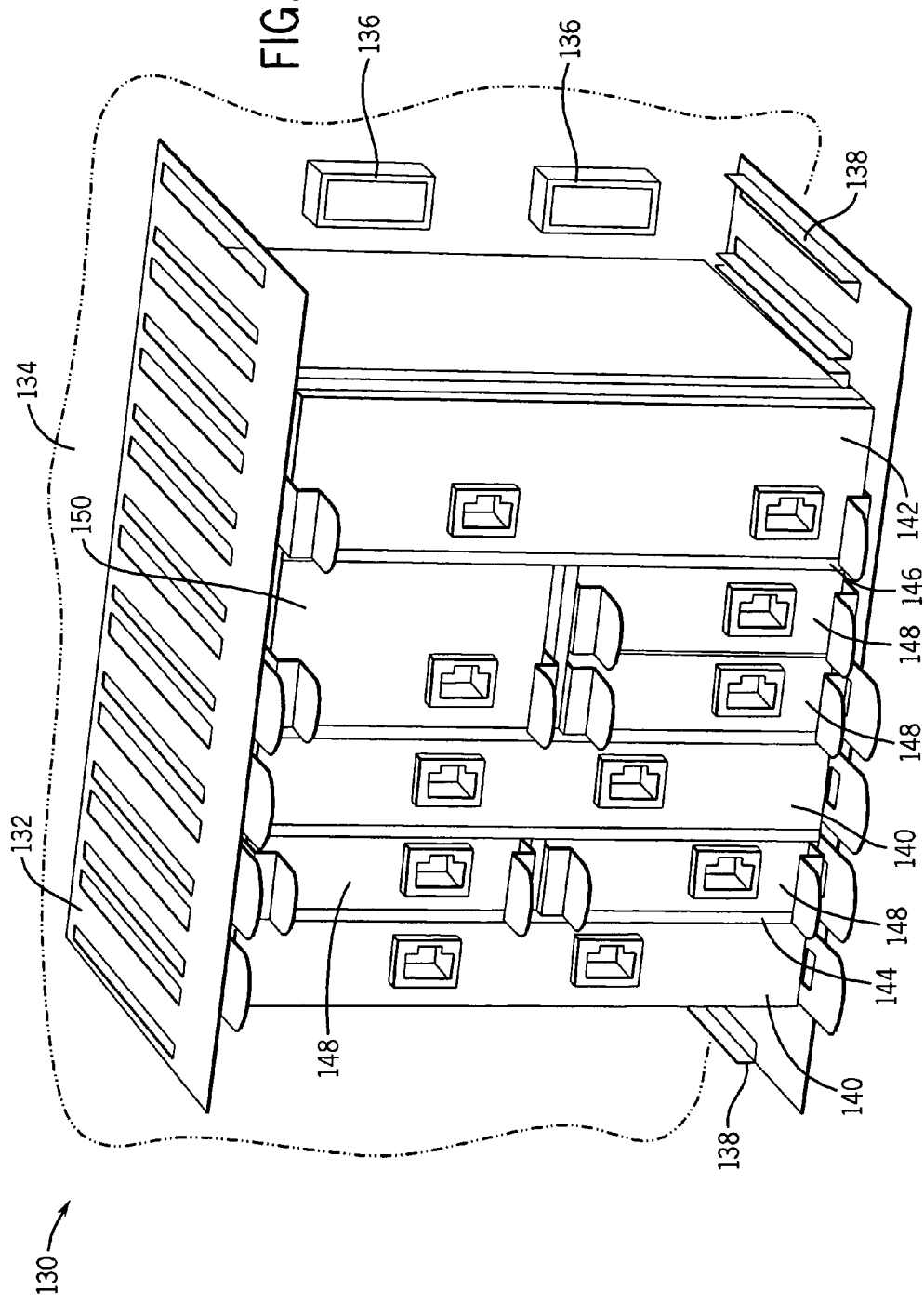
FIG. 6 is a modular cardcage system for housing a plurality of electronic modules and a plurality of adapter sleeves in accordance with one embodiment of the present techniques.

Various electronic modules and adapter sleeves may be inserted in a cardcage, such as modular cardcage system 130 illustrated in FIG. 6. Exemplary system 130 includes a cardcage 132 for receiving a plurality of electronic modules, which connect to a larger system via a backplane 134. Particularly, backplane 134 includes connectors 136 which receive connectors from the electronic modules inserted in cardcage 132. It should be noted that a backplane is a circuit board containing sockets into which other circuit boards can be plugged in, irrespective of the positioning of the backplane in a housing. Cardcage 132 also includes a plurality of guide rails 138 which are configured to cooperate with alignment features of the inserted module and sleeves, such as alignment features 80, 82, and 126, as illustrated in FIGS. 4 and 5.

In one embodiment, the connectors 136 are independent from one another, thus allowing for physically independent backplanes to be used as well as facilitating redundancy in the system. For instance, while a full module 140 may include a sixteen-lane link in one embodiment, in an alternative, high-availability embodiment the full module 140 may include a pair of redundant eight-lane links. In this embodiment, each eight-lane link could independently provide power, management, and communication links, thus providing two independent paths from the module to the system such that operation of the module and system will not be substantially affected if one of the links failed.

Cardcage 132 is configured to receive a plurality of full modules 140. Cardcage 132 is also configured to accept other modules or devices having the same height as full module 140, such as a double-wide full module 142, having a width that is approximately twice that of full module 140; sleeve 144; and double-wide sleeve 146. Sleeve 144 facilitates connection of two base modules 148 to the backplane 134. Similarly, as illustrated, double-wide sleeve 146 allows connection of base modules 148, a double-wide base module 150 that has a width approximately twice that of a base module 148, or some combination thereof, to the backplane 134 of system 130. Thus, through the use of adapter sleeves 144 and 146, a modular system is achieved that allows insertion of electronic modules of varying height and width into a given system.

Figure 7:
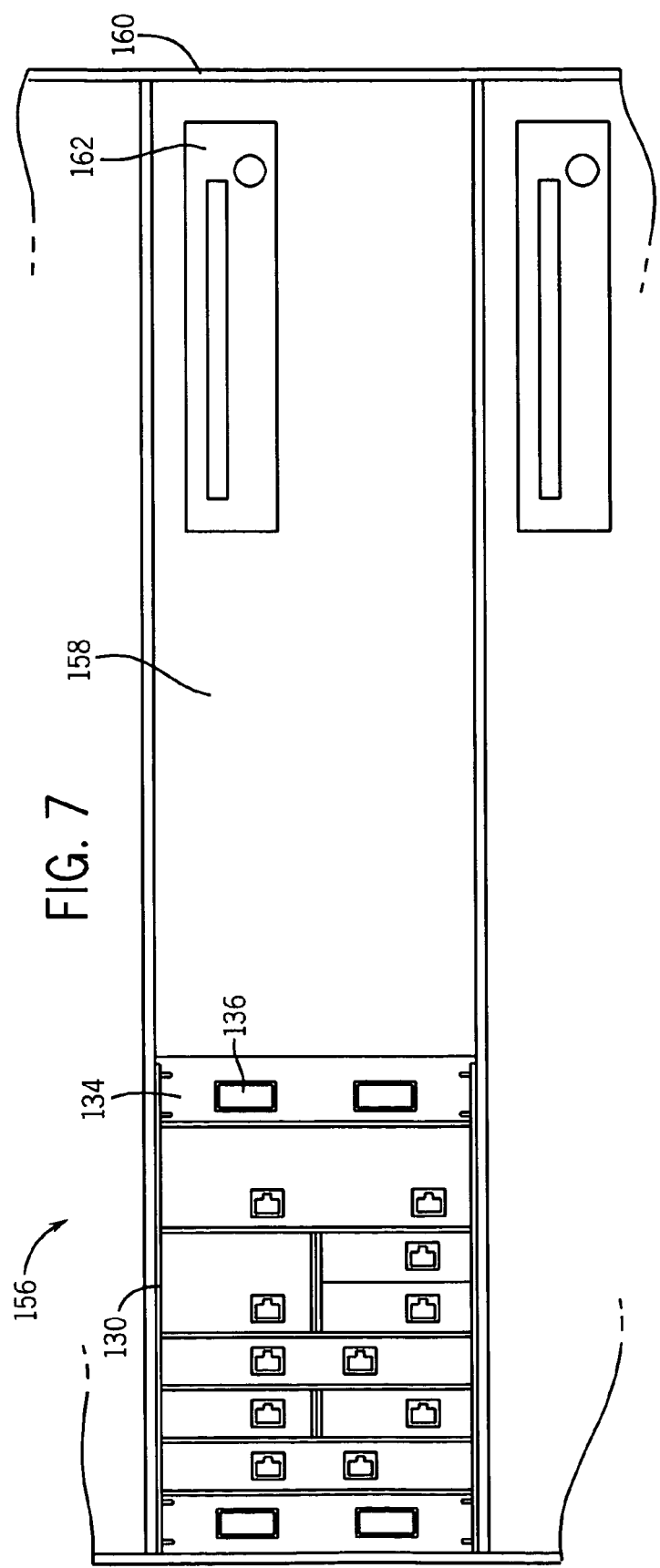
FIG. 7 is an exemplary rack-mounted system including the cardcage of FIG. 6 in accordance with one embodiment of the present techniques.

Notably, exemplary cardcage system 130 may be incorporated into larger electronic systems, such as rack mount system 156 illustrated in FIG. 7. In this particular illustrated embodiment, cardcage system 130 is shown incorporated into a rack mount server 158. As may be appreciated, rack mount server 158 may be inserted into a computing rack 160 and may include a number of peripheral devices, such as a CD-ROM drive 162. Although depicted as a portion of server 158 in the present illustration, it will be appreciated that cardcage system 130 may be incorporated into other systems and devices, including communication extension systems, that may or may not be configured for rack mounting.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A mounting adapter comprising:
    a sleeve comprising:
        a first portion;
        a second portion; and
        a dividing member, wherein the dividing member and the first portion generally define a first volume for receipt of a first electronic module, and the dividing member and the second portion generally define a second volume for receipt of a second electronic module;
    wherein the sleeve is insertable into a slot of a receptacle, the slot sized to receive a third electronic module larger than the first and second electronic modules, the receptacle including a connector that facilitates communication with the first, second, and/or third electronic modules, and wherein at least one of the first or second portions of the sleeve enables a mating connector of the first and/or second electronic module, respectively, to directly engage the connector of the receptacle.

2. The mounting adapter of claim 1, wherein the first volume is substantially equivalent to the second volume.

3. The mounting adapter of claim 1, further comprising an electromagnetic interference shielding gasket coupled to the first and second portions.

4. The mounting adapter of claim 1, further comprising a latch that facilitates coupling of the sleeve to the receptacle.

5. The mounting adapter of claim 1, wherein the sleeve has an internal module guide that facilitates alignment of the first or second electronic module within the sleeve.

6. The mounting adapter of claim 1, wherein the sleeve includes an exterior guide feature that facilitates alignment of the sleeve with a mating guide feature in the receptacle.

7. An electronic system comprising:
    a first electronic component;
    a housing including a slot for receipt of a second electronic component larger than the first electronic component;
    a backplane disposed in the housing, wherein the second electronic component is connectable to other circuitry via the backplane; and
    an adapter sleeve comprising a receptacle for receipt of the first electronic component, wherein the adapter sleeve is positionable within the slot such that the first electronic component is placed in direct electrical communication with the backplane.

8. The system of claim 7, wherein the adapter sleeve comprises another receptacle for receipt of a third electronic component smaller than the second component.

9. The system of claim 8, comprising the third electronic component.

10. The system of claim 7, wherein the housing includes a plurality of slots for receipt of electronic components.

11. The system of claim 7, wherein the first electronic component is a communications module.

12. The system of claim 11, wherein the communications module includes a communications interface on an exterior of the communications module.

13. The system of claim 7, wherein the housing comprises a server.

14. The system of claim 7, wherein the housing is mountable in a computing rack.

15. The system of claim 7, wherein the backplane includes a multi-lane connection link that is bifurcatable into two independent links.

16. The system of claim 7, wherein the adapter sleeve comprises an opening that enables an electrical connector of the first electronic component to directly engage a mating electrical connector of the backplane.

17. The system of claim 7, wherein the adapter sleeve comprises a divider between a first module volume and a second module volume.

18. The system of claim 7, wherein the adapter sleeve geometrically adapts a size of the slot to support a smaller electronic component.

19. A method for adaptively coupling an electronic device to a system, the method comprising:
    receiving an adapter sleeve in a slot of a housing of a system, the slot including a connector and space to receive a first electronic device, wherein the adapter sleeve comprises a receptacle for receipt of a second electronic device smaller than the first electronic device; and
    supporting the second electronic device in the adapter sleeve such that a mating connector of the second electronic device directly engages the connector of the slot.

20. The method of claim 19, wherein receiving the adapter sleeve comprises latching the adapter sleeve to the housing.

21. The method of claim 19, wherein supporting the second electronic device comprises latching the second electronic device to the adapter sleeve.

22. The method of claim 19, wherein supporting the second electronic device comprises slidingly receiving the second electronic device into the adapter sleeve such that the mating connector of the second electronic device engages an electrical backplane of the system via the connector of the slot.

23. The method of claim 19, comprising supporting a third electronic device in the adapter sleeve.

24. The method of claim 19, wherein the adapter sleeve comprises a divider between a first module volume and a second module volume.

25. The method of claim 19, wherein the adapter sleeve geometrically adapts a size of the slot to support a smaller electronic component.

* * * * *